(12) United States Patent
Aipperspach et al.

(10) Patent No.: US 7,242,233 B2
(45) Date of Patent: Jul. 10, 2007

(54) SIMPLIFIED METHOD FOR LIMITING CLOCK PULSE WIDTH

(75) Inventors: Anthony Gus Aipperspach, Rochester, MN (US); David William Boerstler, Round Rock, TX (US); Eskinder Hailu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 10/692,416

(22) Filed: Oct. 23, 2003

(65) Prior Publication Data

US 2005/0091620 A1 Apr. 28, 2005

(51) Int. Cl.
*H03K 3/017* (2006.01)
(52) U.S. Cl. .................... 327/172; 327/165; 327/175; 327/176
(58) Field of Classification Search ............. None
See application file for complete search history.

(56) References Cited

U.S. PATENT DOCUMENTS

| | | | |
|---|---|---|---|
| 3,586,884 A | 6/1971 | Gassmann | |
| 3,594,733 A | 7/1971 | Lukens, II | |
| 3,638,045 A | 1/1972 | Hughes | |
| 3,831,098 A | 8/1974 | Fletcher et al. | |
| 4,245,167 A | 1/1981 | Stein | |
| 4,305,010 A | 12/1981 | Wise | |
| 4,334,243 A | 6/1982 | Srivastava | |
| 4,881,040 A | 11/1989 | Vaughn | |
| 5,268,594 A | 12/1993 | Huang | |
| 5,309,034 A | 5/1994 | Ishibashi | |
| 5,309,456 A | 5/1994 | Horton | |
| 5,789,958 A | 8/1998 | Chapman et al. | |
| 5,929,684 A * | 7/1999 | Daniel | 327/299 |
| 6,060,922 A | 5/2000 | Chow et al. | |
| 6,069,508 A | 5/2000 | Takai | |

(Continued)

OTHER PUBLICATIONS

"Digitalintegrated Circuits—A Design Perspective", Jan M. Rabaey, Prentice Hall (1996) ) Chapter 4, p. 193 Example 4.1.*
Katz, Randy H., "Contemporary Logic Design", Benjamin/Cummings Publishing Company, Inc., Redwood City, CA (1994), pp. 138-139.

*Primary Examiner*—Quan Tra
*Assistant Examiner*—Khareem E. Almo
(74) *Attorney, Agent, or Firm*—Stephen J. Walder, Jr.; Diana R. Gerhardt; Robert M. Carwell

(57) ABSTRACT

The present invention provides for correcting excessive pulse widths using incremental delays. The pulse width is evaluated through a correction block and leak detector. An acceptable pulse passes through an interconnect directly to the clock output. Unacceptable pulses are sent through a block delay module that incorporates a series of delay sub-blocks that disconnect and reset in accordance with a pre-programmed total delay time. The conditioned clock pulse is resent through a node to the correction block and leak detector where it is reevaluated. If the pulse is acceptable, it is sent to the clock output. If the pulse is found unacceptable, it is recycled again. A high low clock pulse shuttle determines and alters the high or low state of the clock pulse to ensure a correct output to downstream dependent devices.

21 Claims, 13 Drawing Sheets

U.S. PATENT DOCUMENTS

| | | |
|---|---|---|
| 6,486,722 B2 | 11/2002 | Yamauchi |
| 6,918,050 B2 | 7/2005 | Yoshikawa et al. |
| 2001/0011913 A1* | 8/2001 | Sher .......................... 327/165 |
| 2003/0102896 A1* | 6/2003 | Porter et al. ................ 327/174 |
| 2005/0010885 A1 | 1/2005 | Aipperspach et al. |
| 2005/0035801 A1 | 2/2005 | Weiner |

* cited by examiner

SIMPLIFIED METHOD FOR LIMITING CLOCK PULSE WIDTH

TECHNICAL FIELD

The present invention relates generally to the field of computer systems and, more particularly, to limiting pulse widths in a microprocessor clock.

BACKGROUND

Many digital devices from the simplest gate array to the most complex circuit board can require one or more clocks, and one or more clocking signals, for a variety of routine and critical processes. An example of a critical process is the feeding of signals from a processor to a bus. Without a precise timing mechanism, synchronizing the signals in the bus would be impossible.

Another example is in memory arrays where nodes are pre-charged to a specific logic level. A clock signal is applied to access these nodes or to perform some other function. One concern circuit designers have is that if the clock signal is in the 'high' state for too long a duration, it can discharge these pre-charged nodes or cause charge sharing between nodes and the logic value can be lost. Therefore, the goal is to limit the maximum pulse width of such signals that operate on latches, memory, etc.

Duty cycle distortion (DCD) and pulse-width distortion (PWD) are different names for the same problem. PWD can be defined as the difference between the pulse width of a 'high' output (representing a "1") and the pulse width of a 'low' output (representing a "0"). PWD causes a distortion in the eye diagram, where the eye crossings are offset up or down from the vertical midpoint of the eye. (In digital communications, the "eye diagram" is used to visualize how the waveforms used to send multiple bits of data can potentially lead to errors in the interpretation of those bits).

PWD can be quantified by driving the system with a clock-like pattern (such as 1 0 1 0 . . . ), measuring the width of the 'high' and 'low' pulses, and then using the following equation:

$$PWD = \frac{[(\text{longer pulse}) - (\text{shorter pulse})]}{2}$$

The most common causes of PWD are voltage offsets between the differential inputs and differences between the rise and fall times in the system.

Deviation from a reference standard, usually expressed in ±ps (plus or minus picoseconds), can occur on the leading edge or the trailing edge of a signal. PWD can be induced and coupled onto a clock signal from many different sources and is usually not uniform over all frequencies. Excessive PWD can increase the bit error rate (BER) of a communication signal by incorrectly transmitting the data bit stream. This leads to a violation of frequency and amplitude, causing partial or complete circuit failure.

Previous attempts to solve PWD problems center on pulse width modulation (PWM), space vector modulation (SVM), feedback loops or signal clamping. Typically, these solutions contain a large number of discrete devices, and require one subsystem for controlling the pulse width and another for limiting the duty cycle. As a result, additional latency (time delay) is introduced in the overall circuit, offsetting some the gains in signal quality.

The newest generations of ultra high density circuits also mandate lower device counts because of the requirements for additional system features in the architecture, the emphasis on lower power usage at increasing frequencies, and the inevitable power dissipation (heat) problems. Problems of current leakage, capacitance and signal contamination are magnified in all superscalar architectures.

As a result, there is a need for a pulse width limiting method for maintaining peak clock performance that solves some of the limitations of previous designs. The ideal circuit would solve the pulse width problem and reduce the device count, all without substantial change to the system architecture. Limiting the number of devices also allows for an increase in clock frequency, and higher frequency clocks are more efficient.

SUMMARY OF THE INVENTION

The present invention provides for controlling a pulse width generated by a clock. The pulse goes to a control circuit and is evaluated for validity. Valid pulses exit to the system. Invalid pulses are modified by a processing circuit, rechecked, further corrected if necessary, and then exit the system.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

In the remainder of this description, a pulse limiting circuitry (PLC) may be a sole processor of digital logical operations for correcting clock signal variations in a device. The PLC may also be one of many processing units that share the clock signal according to some methodology or algorithm developed for a given computational device.

All PLCs process instructions under variable voltage conditions that range from full voltage at design architecture maximum to zero voltage (wherein the PLC is processing no clock signal). For the remainder of this description, all references to pulse limiting shall use the term "pulse limiting" whether the pulse limiter is the sole computational element in the device or whether the pulse limiter is sharing the signal conditioning function with other pulse limiters, unless otherwise indicated.

It is further noted that, unless indicated otherwise, all functions described herein may be performed in either hardware or software, or some combination thereof. In this representative system, however, the functions are performed by a block delay module and correction block, such as in a computer or an electronic data processor, in accordance with code, such as computer program code, software, and/or integrated circuits that are coded to perform such functions, unless indicated otherwise.

Figure 1:
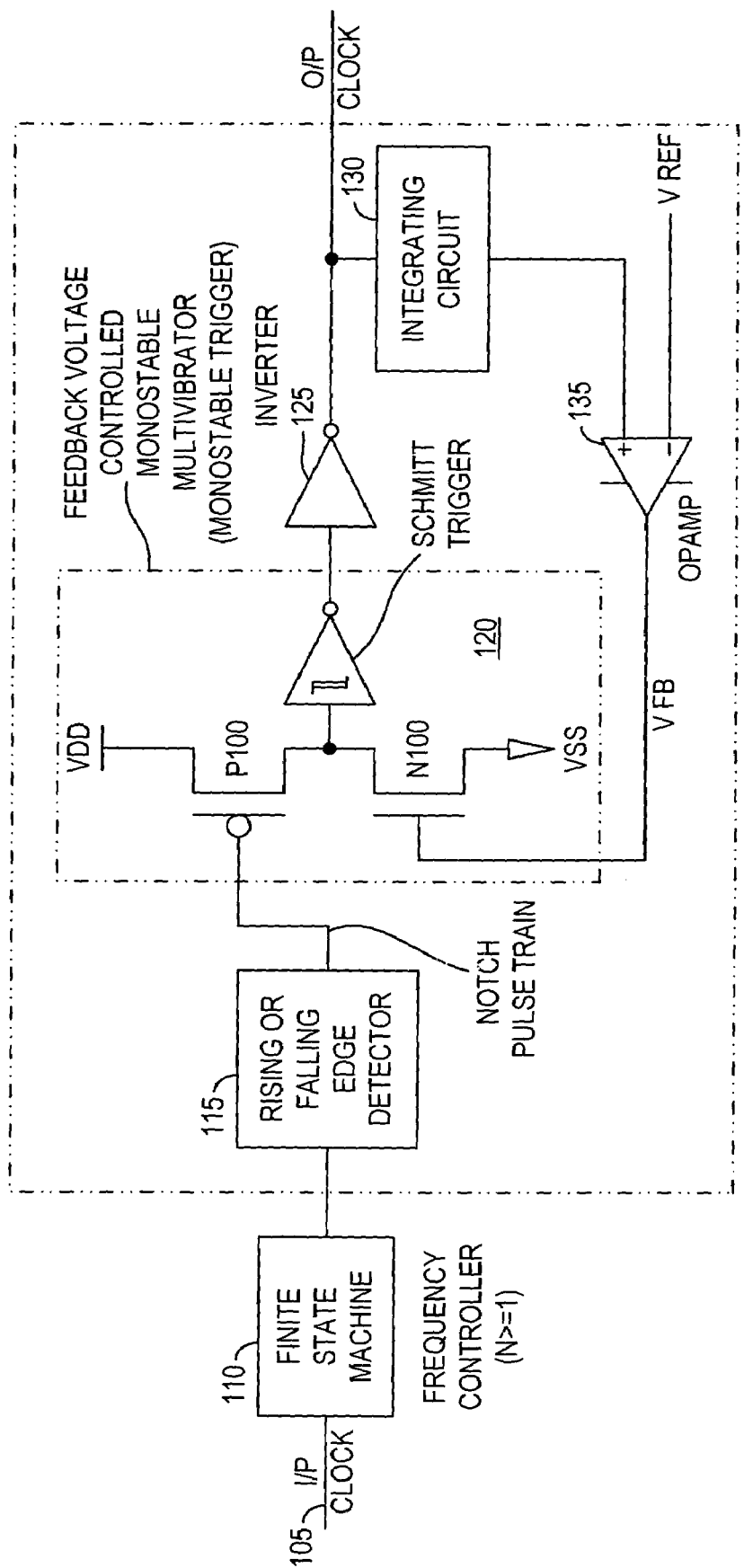
FIG. 1 illustrates a prior art pulse width control buffer system.

Turning now to FIG. 1, disclosed is a conventional pulse width buffer control, using a plurality of subsystems. The composition and the function of the subsystems are as follows.

An irregular clock input 105 arrives from a source clock and enters a finite state machine 110, which functions as a frequency controller, allowing a single output signal for a specified number of input signals. The finite state machine 110 is further connected to a rising or falling edge detector 115 that outputs a one shot train signal to the monostable trigger 120. The monostable trigger 120 is variably comprised of inverse logic gates and delay latches. This output signal is the same frequency as the input signal, but significantly less than 50% duty cycle. Changes in voltage in a feedback loop, beginning at P100 (positive FET), further cleans the clock signal by forcing it to conform to an assumed ideal pulse shape. Inverters can perform the same function. The cleaned and conditioned signal is then passed independently to an inverter 125, and to an operational amplifier (OPAMP) 135.

The OPAMP 135 is typically a high gain amplifier, with the negative input receiving a predetermined reference voltage from outside the monostable trigger 120, and it is adjusted by the complementary signal difference between a reference voltage and the rising or falling edge detector voltage 115. This in turn adjusts the force voltage at P100. A final integrating circuit 130 blends the signal passed through the inverter 125 and the reference signal arriving at OPAMP 135 to obtain an average voltage equal to the design requirements of the system.

The essential complexity of this arrangement, to persons skilled in the art, is apparent. Each of the subsystems, taken separately or together, can introduce a 'high' degree of latency in the timing mechanism that can lead to serious routing or computational issues, particularly in micron level superscalar architectures.

Figure 2:
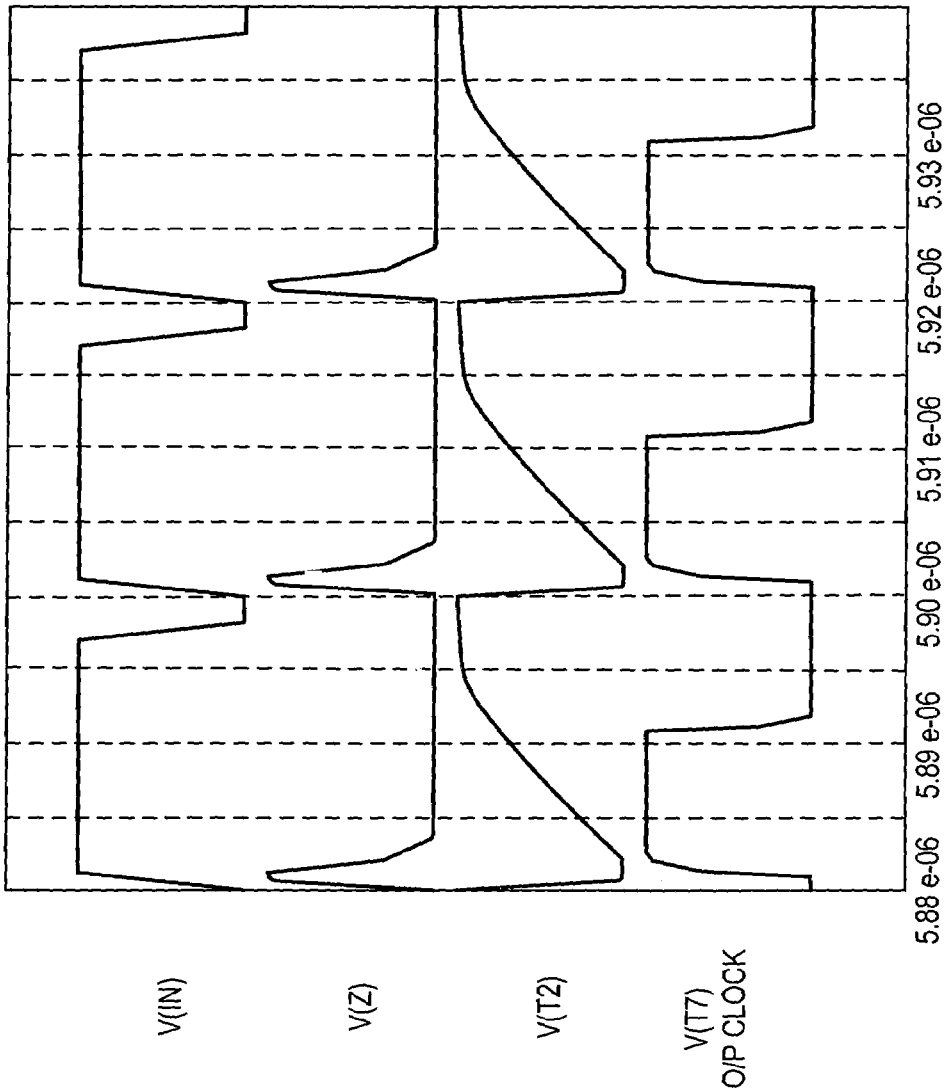
FIG. 2 illustrates a representative waveform diagram depicting results of the prior art pulse width control buffer system.

Turning now to FIG. 2, which shows a simulation test result for the prior art invention discussed above, the waveform is a result of a 50 MHz input clock with a ten percent and fifty percent duty cycle, respectively. The simulation waveform clearly indicates that the ten and eighty percent duty cycles were successfully corrected to an approximate fifty percent duty cycle output with stabilized pulse width. This comparison is important to the present invention in its degree of similarity when the comparison includes a count of the number of discrete items in the systems and their inherent effect of signal processing latency.

Figure 3:
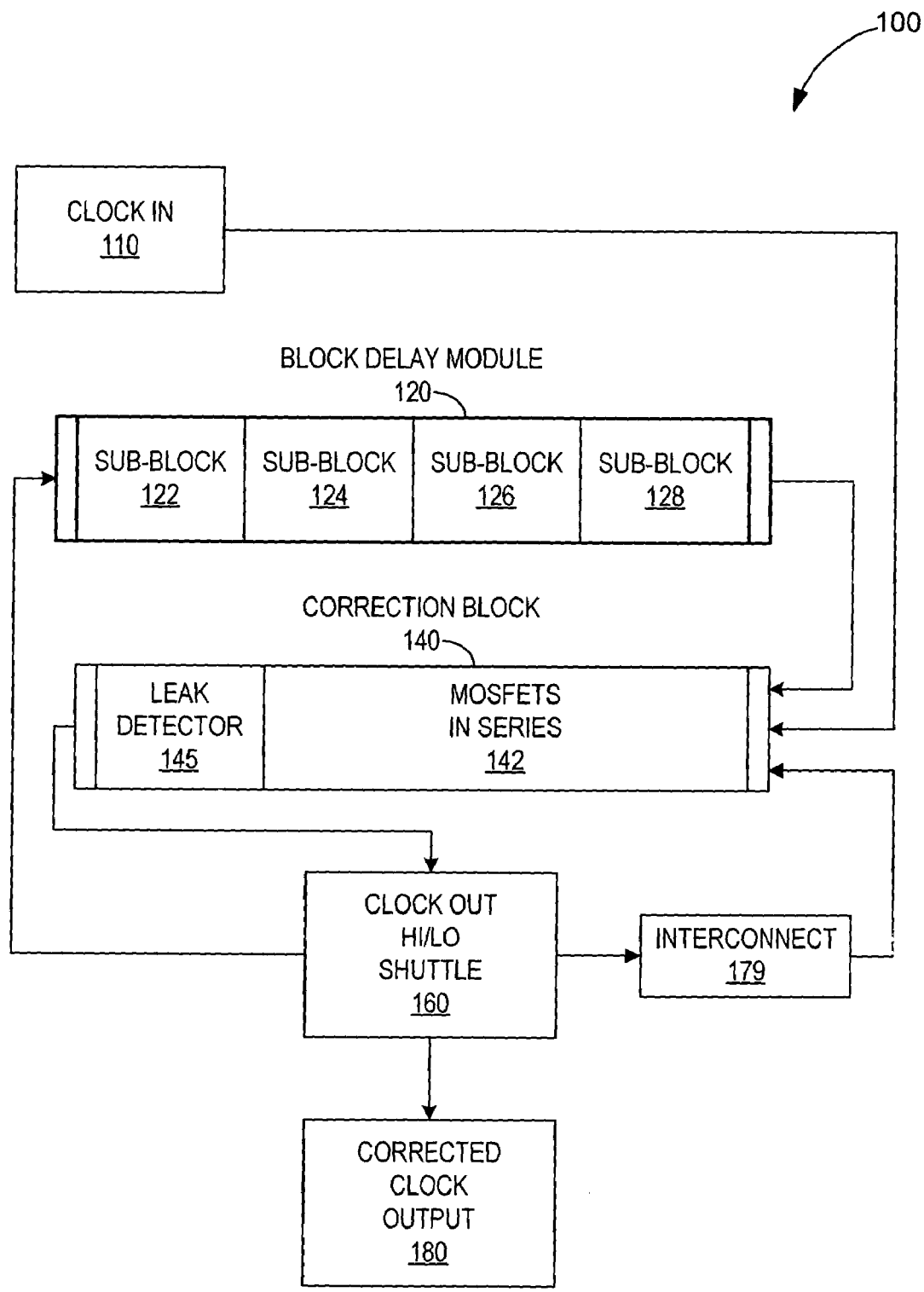
FIG. 3 diagrams the basic process flow of the present invention.

Turning now to FIG. 3, illustrated is a diagram of the basic process flow of the present invention in a system 100. A digital clock 110 signal of any origin is introduced to a correction block 140. The correction block 140 references the clock signal to a leak detector 145. A clock hi/lo shuttle 160 shunts the clock signal to a block delay module 120, (employing a plurality of sub-blocks 122 to 128), inclusive, via an interconnect 179, if the clock pulse width is outside of the calculated limits. If not, the clock hi/lo shuttle 160 passes the acceptable signal as corrected clock output 180. A clock signal that is within the calculated limits bypasses the block delay module 120. The importance of establishing the maximum allowable value of the duty cycle of the clock signal which can pass, unchanged, to the clock output 180, is as follows.

Digital clock signals are represented in typical processor systems as a '1' or a '0', with '1' the high state (equal to one-half of the duty cycle [(also known as clock cycle]) and '0' as the low state or off state of the duty cycle. Usually, the concern of a system designer has to do with the amount of time the device or circuit is turned on (at a '1' or high state). Extended periods of time at high states can lead to various device and circuit disruptions such as premature node discharge and charge sharing (where two or more devices receive less than the charge each needs to perform some assigned function). At state of low or '0' is very similar to a wait state, and this device is not actively engaged in the system, thereby generally incapable of causing harm.

Therefore, there exists a need to limit the maximum time a device is in the high state. Depending on the system design or application, a particular value of time, such as 90 picoseconds, is decided on as the maximum pulse width. In other words, if the period of the clock is such that clock in equals clock out, or is less than clock out, the device or application is driven correctly (or not at all, which is acceptable because 'not at all' would be the low state). Only clock pulse values that exceed pulse width time 'N' will be chopped. The exact amount of delay needed is established through installing some certain number of sub-block 124 delays that cascade in succession until the pulse width is made equal to or less than the original pulse.

Figure 4:
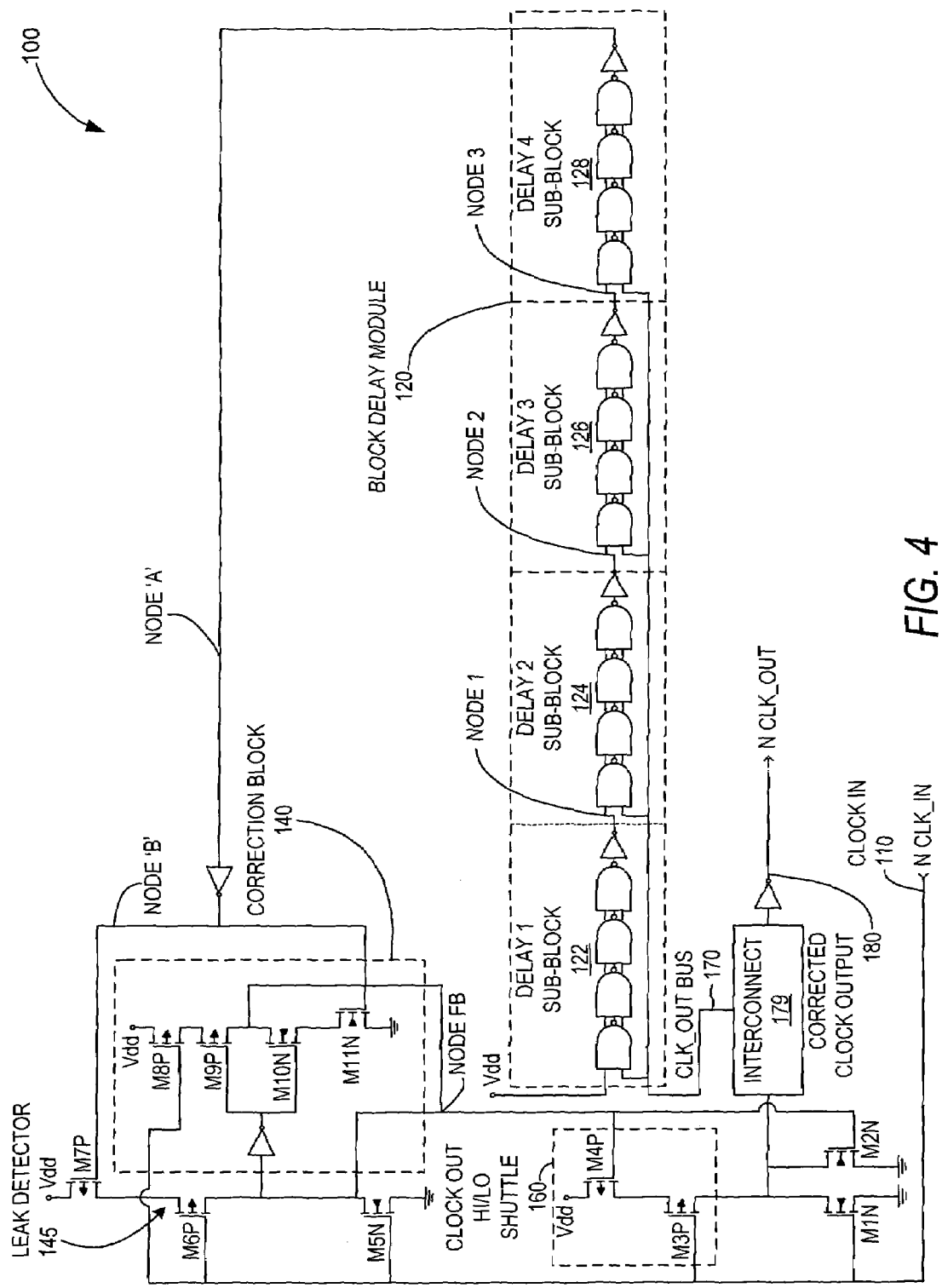
FIG. 4 schematically depicts one embodiment of the generalized logical delay block and gate system limiting excessive pulse width.

Turning now to FIG. 4, disclosed is a pulse width limiting system 100 having principally, a block delay module 120 and a correction block 140.

In FIG. 4, those of ordinary skill in the art understand that a distinction is made between acceptable pulse widths and those that are unacceptable. All pulses that fail necessarily, by definition, cause the entire architecture that is clock cycle dependent to perform below specifications, or not work at all.

A primary purpose of passing the clock signal through the circuit is to clearly define when the clock pulse signal meets design specifications, as previously discussed in FIG. 3. Logically, there is no purpose in conditioning every pulse that enters the system. At a minimum, at least one-half of the pulses will not negatively affect downstream devices, because low states generally have no deleterious affect on device or application operations. The device or application is only waiting for an energizing input. Furthermore, not every high state pulse is in a state of excessive width. In a well designed system, the types of pulse jitter leading to clock errors should be extremely low. As a result, a small minority of pulse will need conditioning (pulse width limiting). There is simply no purpose to tie up system resources and reintroduce the very latency that a low device count system, such as the present invention, purports to solve.

The selection of the division is dependent on a plurality of processor architecture design elements. However, it is preferential to place the pulse width limiting device in a location within close proximity to the clock, to take advantage of the decreased latency and provide conditioning to downstream elements. It can be modeled and coded in hardware or in software, or any number of modulated states can be asserted, and any number of clock pulses can be input or output. Generally, clock pulse width devices are hardware devices, as is in this exemplary system.

Furthermore, those of ordinary skill in the art understand that both the block delay module 120 and the correction block 140 can be logically and physically divided into segments or sectors for clock pulse control purpose. The segments or sectors at block delay module 120 and correction block 140 can contain a plurality of gates, registers and other logic devices in hardware. These devices may be switched by interrupt codes. Interrupt codes inform systems, sub-systems and related devices to stop processing their instructions.

Each delay sub-block (sub-block 122 to sub-block 128) has a delay associated with it, referenced as "τ". Each sub-block is comprised of at least one NAND logic gate. Where there are two or more NAND gates, the gates are electrically connected in a serial arrangement. This is a NOT-AND circuit which is equal to an AND circuit followed by a NOT circuit. The outputs of all NAND gates are high if any of the inputs are low.

Furthermore, each delay element has two inputs and one output. For example, Delay 1 has two inputs, Vdd and CLK_OUT, and the output is Node 1. Delay 2 inputs consist of Node 1 and CLK_OUT, where the output is Node 2. Delay 3 has the two inputs of Node 2 and CLK_OUT, with an output at Node 3. Finally, Delay 4 has inputs of Node 3 and CLK_OUT, while the output is through Node 'A'.

The logical description of each delay element in the present example is described as follows in Table 1.

TABLE 1

Delay Element Truth Table

| In1 | In2 | Out |
|---|---|---|
| H | H | H |
| H | L | L |
| L | H | L |
| L | L | L |

H = HIGH
L = LOW

However, this is only one matrix of several combinatorial arrangements. When the number of fixed elements is increased, the size of the matrix will increase and so will the total number of combinatorial possibilities.

The largest frequency at which this architecture works is determined by the amount of time it takes to reset each delay element. In FIG. 4, at each delay sub-block 1 to 4, the time it takes to reset each block is equal to τ.

That is, the signal delay (τ), as well as reset time ($τ_{reset}$), is made equal, though there is no physical or logical requirement to do so in order for the invention to work as designed. Signal delay over reset time can be made unequal. It is only an expression of the desired outcome of the pulse width for devices using the associated clock pulse. In this example, the maximum allowable frequency of N CLK_IN 110 is given by ½τ.

In the following description of the logical implementation of the circuit, reference is made to metal oxide semiconductor field effect transistors (MOSFETS) as 'M', numbered consecutively M1N through M1N1N. It is further noted that there is no particular design limitation on the number of MOSFETS, or similar digital devices, that are incorporated in a particular pulse width limiter design.

MOSFETs are a special type of field-effect transistor (FET) that works by electronically varying the width of a channel along which charge carriers flow. The wider the channel, the better the device conducts. The charge carriers enter the channel at the source and exit via the drain. The width of the channel is controlled by the voltage on an electrode called the gate, which is located physically between the source and the drain and is insulated from the channel by an extremely thin layer of metal oxide.

There are two ways in which a MOSFET can function. The first is known as depletion mode. When there is no voltage on the gate, the channel exhibits its maximum conductance. As the voltage on the gate increases (either positively or negatively, depending on whether the channel is made of P-type or N-type semiconductor material), the channel conductivity decreases. The second way in which a MOSFET can operate is called enhancement mode. When there is no voltage on the gate, there is, in effect, no channel and the device does not conduct. A channel is produced by the application of a voltage to the gate. The greater the gate voltage, the better the device conducts.

The MOSFET has certain advantages over the conventional junction FET, or JFET. Because the gate is insulated electrically from the channel, no current flows between the gate and the channel, no matter what the gate voltage (as long as it does not become so great that it causes physical breakdown of the metallic oxide layer). Thus, the MOSFET has practically infinite impedance. This makes MOSFETs useful for power amplifiers. In the present invention, the devices function primarily as high-speed switches.

When N CLK_IN 110 is 'high' (logical one), M1N is turned on, M3P is turned off and CLK_OUT is pulled 'low' (logical zero). CLK_OUT is one of the inputs of all the delay elements. When CLK_OUT is 'low', then all the delay elements are in the reset mode. That is, all their outputs are 'low'. Consequently, Node 'B' is 'high' and M7P is off. Since N CLK_IN 110 is also connected to M5N, when N CLK_IN 110 is 'high' node, FB is 'low' and M2N is off. Therefore, whenever N CLK_IN 110 is 'high', CLK_OUT is always 'low'.

Conversely, when N CLK_IN 110 is 'low', M1N is off and M3P is on. Also, M5N is off and M6P is on. Node 'B' is still 'high' and therefore M7P is off. Additionally, node FB is disconnected from either power supply (Vdd) or Ground (GND).

Barring leakage currents, node FB will retain its last value. That last value is 'low'. Therefore, M4P is on, M3P is on, and M1N and M2N are off. This means CLK_OUT 170 is 'high'. Under this condition, all the delay blocks are in the pulse width limit mode.

In other words, it takes Nτ time for a signal from CLK_OUT 170 to propagate to Node 'A' where N is the number of delay elements while τ is the delay associated with each block. Therefore, after a time, Nτ node 'A' becomes 'high' and Node 'B' becomes 'low'. This turns M7P on. Since M6P is on while M5N is off, node FB is connected to Vdd, i.e., FB becomes 'high'. When FB is 'high', M4P is off and M2N is on. As a result, CLK_OUT 170 is pulled 'low'.

If the pulse width of N CLK_IN 110>Nτ, then the maximum pulse width of CLK_OUT 170 is given by Nτ, where N CLK_IN is the inverse of CLK_IN, and N CLK_OUT is the inverse of CLK_OUT. Therefore, when the pulse width of N CLK_IN 110<=Nτ, N CLK_IN=N CLK_OUT.

The correction block 140 is at the front end of the system 100, accepting a first input of N CLK_IN 110. The correction block 140 is used to control or modify the behavior of node FB. When N CLK_IN 110 is 'high', M5N is on and node FB is connected to GND, i.e., FB is 'low'. Therefore, if the input needs no modification, the signal is returned from the clock hi/lo shuttle 160, to the interconnect 179, where it passes to the processor through N CLK_OUT.

When N CLK_IN 110 is 'low', M5N is off, M6P is on, and M7P is off for a time period equal to NT. During this period, node FB is essentially floating and, assuming no leakage, it will retain its last value ('high' or 'low'). However, if there is a substantial amount of leakage, for example, between M6P and M7P, then FB can be pulled up to Vdd prematurely.

To eliminate the risk that arises from the floating of node FB, a correction circuit is added. A floating node problem occurs when a node cannot detect a voltage applied across it, so the branch is electrically disconnected from the circuit for a time.

When N CLK_IN 110 is 'high', M6P and M9P are off. So any possible path between node FB and Vdd is disconnected and, since M5N is on, node FB is pulled down as required. When N CLK_IN 110 is 'low', M5N is off and both M6P and M8P are on. Because the last state of node FB is 'low', then via the inverter in the correction block, M10N is switched on. For the duration equal to Nτ, node B is 'high'. So, for that duration, M11N is also switched on. As a result, there is a direct path, via M10N and M11N, between node FB and GND. In other words, for the time duration equal to Nτ, node FB is not floating but is directly tied to GND as desired. After Nτ times have passed, node B is pulled 'low', M7P is on, M6P is on and M5N is off. Accordingly, there is a direct path between FB and Vdd, so FB is pulled 'high'. As node FB starts to pull towards Vdd, it accelerates the rate at which M9P is turned on and M10N is turned off. This is accomplished via the positive feedback path using the inverter. This further pulls node FB to Vdd.

Figure 5:
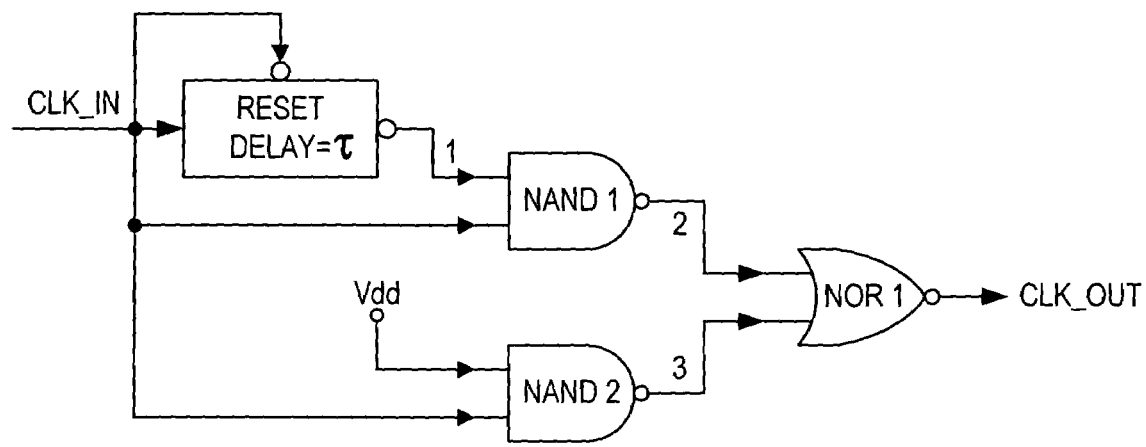
FIG. 5 schematically depicts one embodiment of the connection of a delay sub-block in a serial configuration.

Turning now to FIG. 5, illustrated is an expanded view of one embodiment of the logical delay/gate connection schema. CLK_IN is connected electrically to the input of a representative delay block. The output of the delay block is electrically connected to a source of a NAND gate 1. CLK_IN is further connected, electrically and in an alternating manner, to the source input of the NAND gate 1 and the drain input of a parallel or successive NAND gate 2. One input to the last NAND gate in the series is always connected to Vdd. The outputs of NAND gate 1 and NAND gate 2 are affixed to input 2 and input 3 of NOR gate 1. NOR gate 1 functions as an inverter, converting the output of the NOR gate to logical low (zero state) when either output NAND gate 1 or NAND gate 2 is at logical high (one state).

Figure 6:
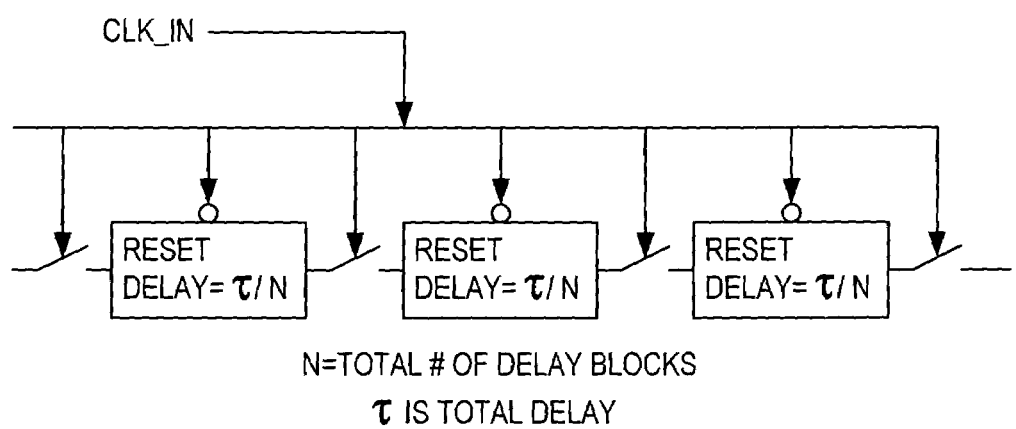
FIG. 6 schematically represents a train of sub-block delays contained in a delay and further depicted as part of the clock pulse width correction system.

Turning now to FIG. 6, illustrated is an expanded view of a collection of representative delay sub-blocks, showing the relative connection of the elements to each other. Where τ is the total delay, the number of delay sub-blocks required, assuming each block's delay is τ/N, is N. The number of N sub-blocks can equal the total delay τ or not equal the total delay. Furthermore, it is not necessary that each delay block introduce identical delay. The total number of blocks and delay is dependent on the design architecture. Each of the delay sub-blocks, however, is itself, of fixed picoseconds duration.

A controllable delay element fixes the maximum pulse width to a specified time period. The delay element has a reset input that is controlled by CLK_IN (as illustrated in FIG. 4). The delay element consists of standard delay latches (without the reset capability) that delay any input by an amount equal to a specified time period. If the up time of the input clock is larger than a specified time period, then the system architecture works in accordance to what is expected. That is, the maximum width of the pulses is limited to a specified time period. If the input signal has an up time less than or equal to a specified time period, the entire signal goes through to the output.

To maintain the same frequency at the output as in the input, a reset component is added to the delay element. In the circuit architecture, the delay element is divided into smaller delay sub-blocks. Each delay sub-block is connected to adjacent delay sub-blocks when CLK_IN is 'high'. For any number of such delay sub-blocks, the delay of each block, assuming each block has identical delay, will be given by a specified time period divided by the number of blocks. When CLK_IN is 'low', each delay block is logically or electrically disconnected from adjacent delay blocks and is 'reset'.

CLK_IN is connected electrically to the input of each delay sub-block and to the source input of each NAND gate in series configuration with the delay sub-block (as described in FIG. 4). Each delay sub-block is connected to an adjacent delay sub-block only when CLK_IN is 'high'. At CLK_IN 'low', each delay sub-block is first disconnected from the preceding delay sub-block and second, reset to zero. The maximum frequency performance of this circuit is directly proportional to the time it takes to reset each delay element. For a 50% duty cycle CLK_IN, the maximum allowable frequency is given by $\frac{1}{2}\tau_{reset}$, where $\tau_{reset}$ is the time it takes to reset each delay sub-block.

Figure 7:
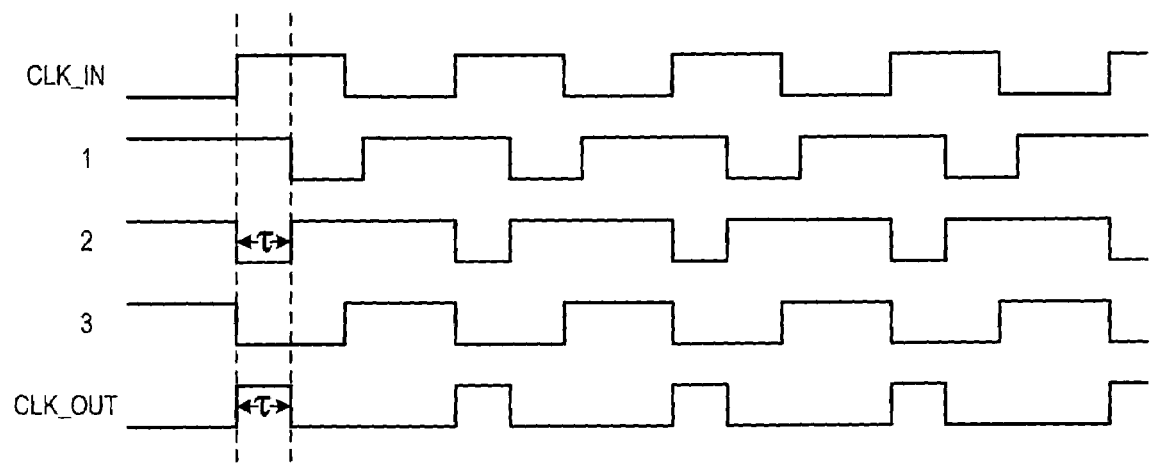
FIG. 7 illustrates an example of a corrected clock pulse waveform when a pulse width exceeds the maximum allowed pulse width (τ)

Turning now to FIG. 7, illustrated is an example of a corrected clock pulse waveform. CLK_IN represents an input to a device requiring a clock signal, when the architecture limits the pulse to width τ. The period of the incoming pulse is >2τ. The τ time at 'low' at line 2 is equal to the 'high' at line CLK_OUT, which is the desired state.

Figure 8:
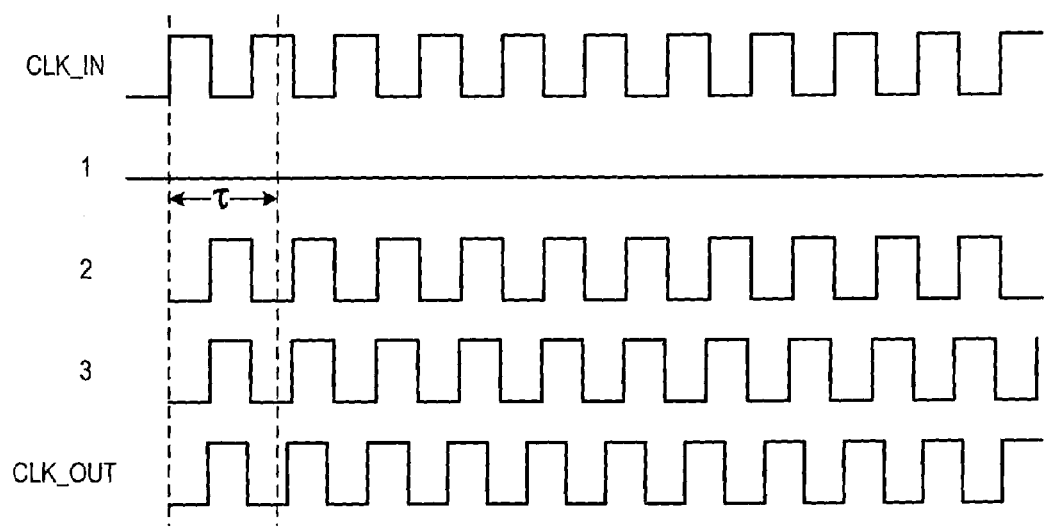
FIG. 8 shows a clock pulse waveform for a specified maximum allowed pulse width τ that is larger than the CLK_IN pulse, resulting in the equation CLK_IN=CLK_OUT.

Turning now to FIG. 8, illustrated is a waveform example of the frequency performance of this architecture when the pulse width of CLK_IN=<τ. Since τ is larger than the pulse width of CLK_IN, node 1 is always in the reset mode at logical one ('high'). This results in the desired state of CLK_OUT=CLK_IN.

Figure 9:
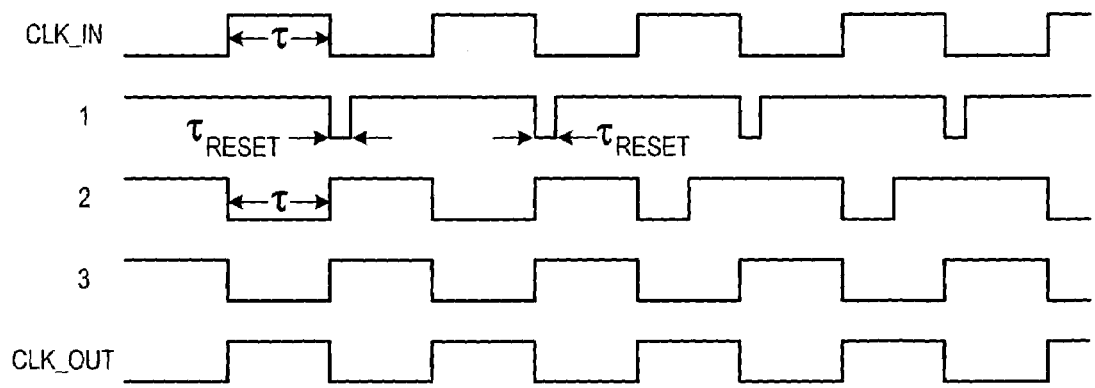
FIG. 9 illustrates actual composite performance of the present invention within a circuit when pulse width of CLK_IN=τ.
Figure 9:
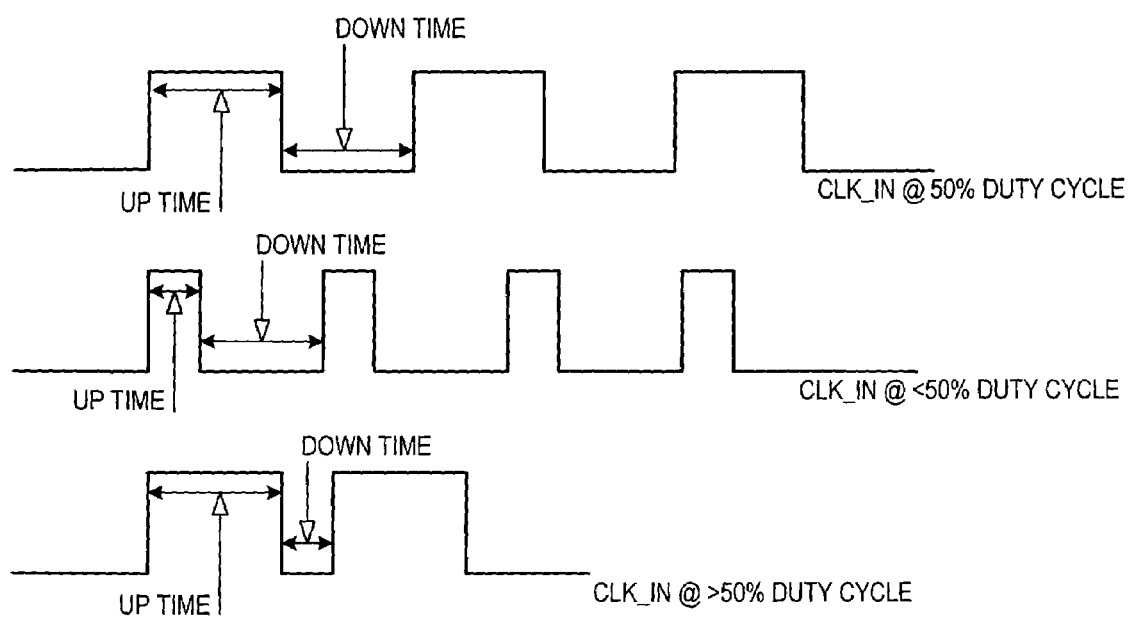
Figure 10:
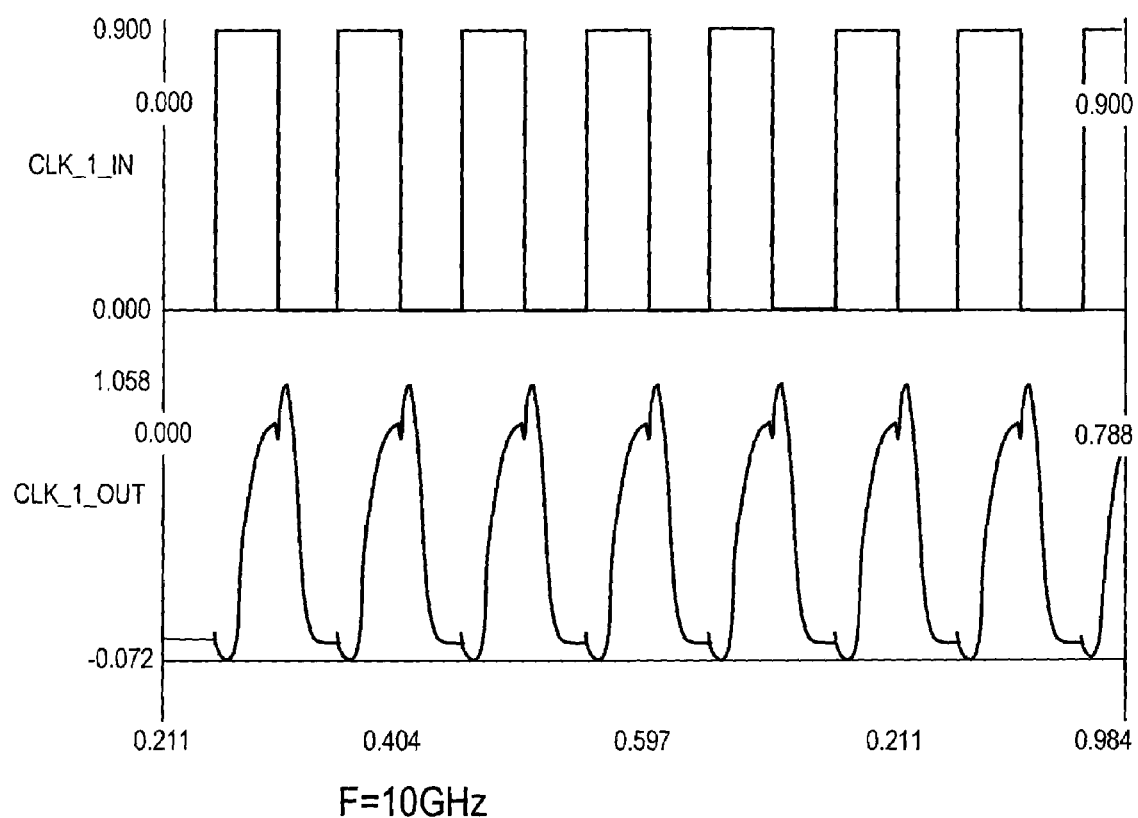
FIG. 10 illustrates a simulation result at an input frequency of 10 GHz and 50% duty cycle when the maximum allowable pulse width is set to ~400 picoseconds.
Figure 11:
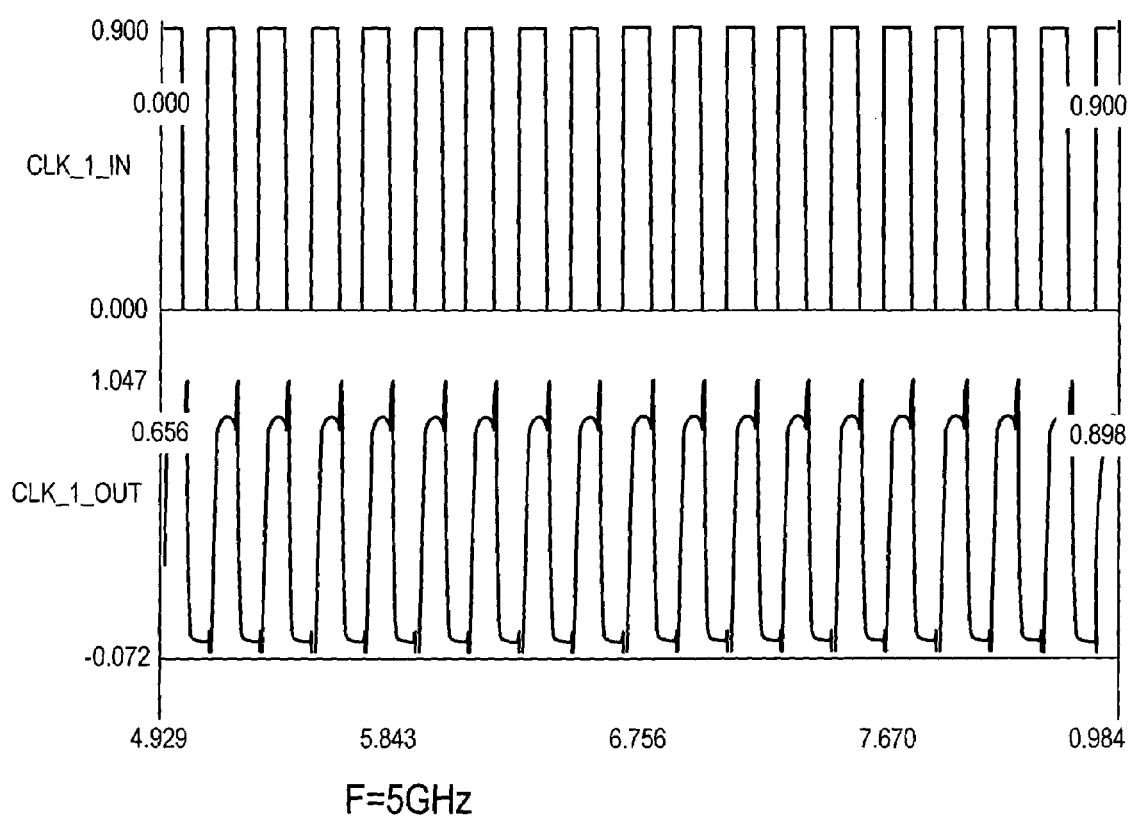
FIG. 11 illustrates a simulation result at a frequency of 5 GHz and 50% duty cycle when the maximum allowable pulse width is set to ~400 picoseconds.

Turning now to FIG. 9, illustrated is an exemplary composite performance of the circuit when the pulse width of CLK_IN=τ. Note the smooth continuity at the cross-over point within each waveform. There are no glitches created by the reset of the delay sub-blocks during $\tau_{reset}$.

Figure 12:
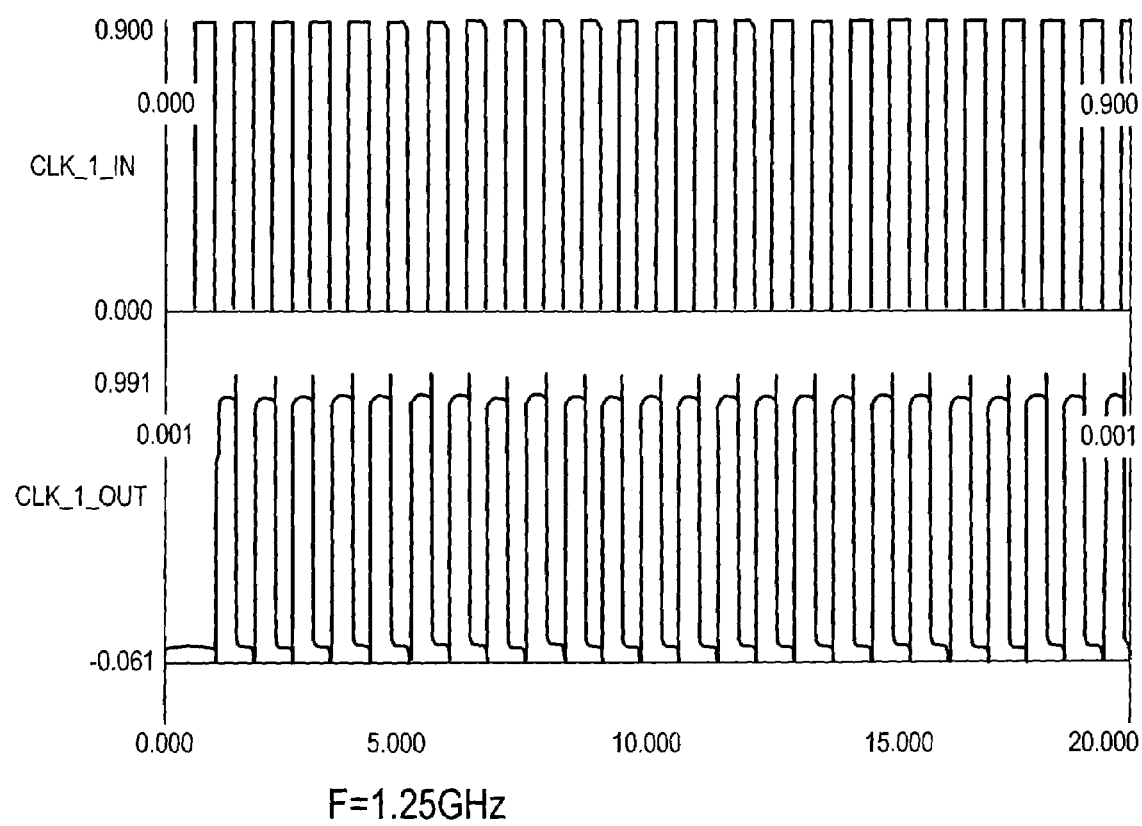
FIG. 12 illustrates a simulation result at a frequency of 1.25 GHz and 50% duty cycle when the maximum allowable pulse width is set to ~400 picoseconds.
Figure 13:
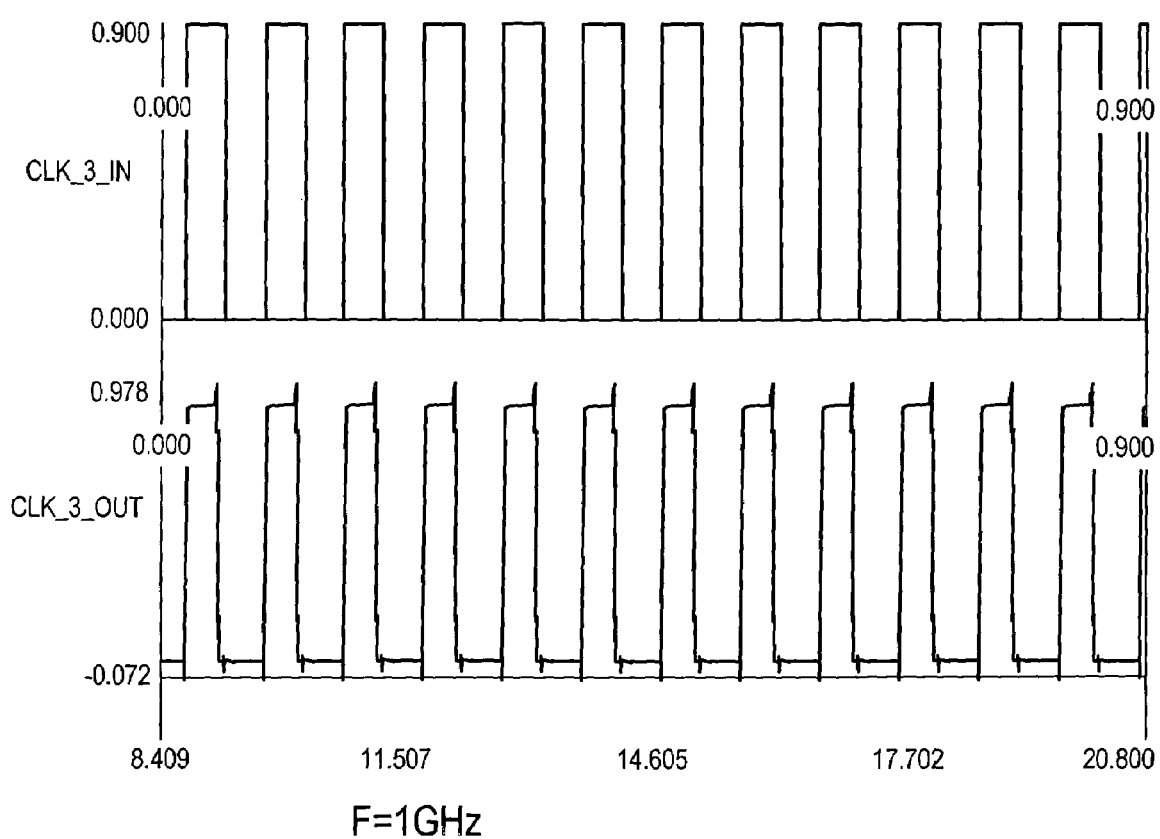
FIG. 13 illustrates a simulation result at a frequency of 1 GHz and 50% duty cycle when the maximum allowable pulse width is set to ~400 picoseconds.
Figure 14:
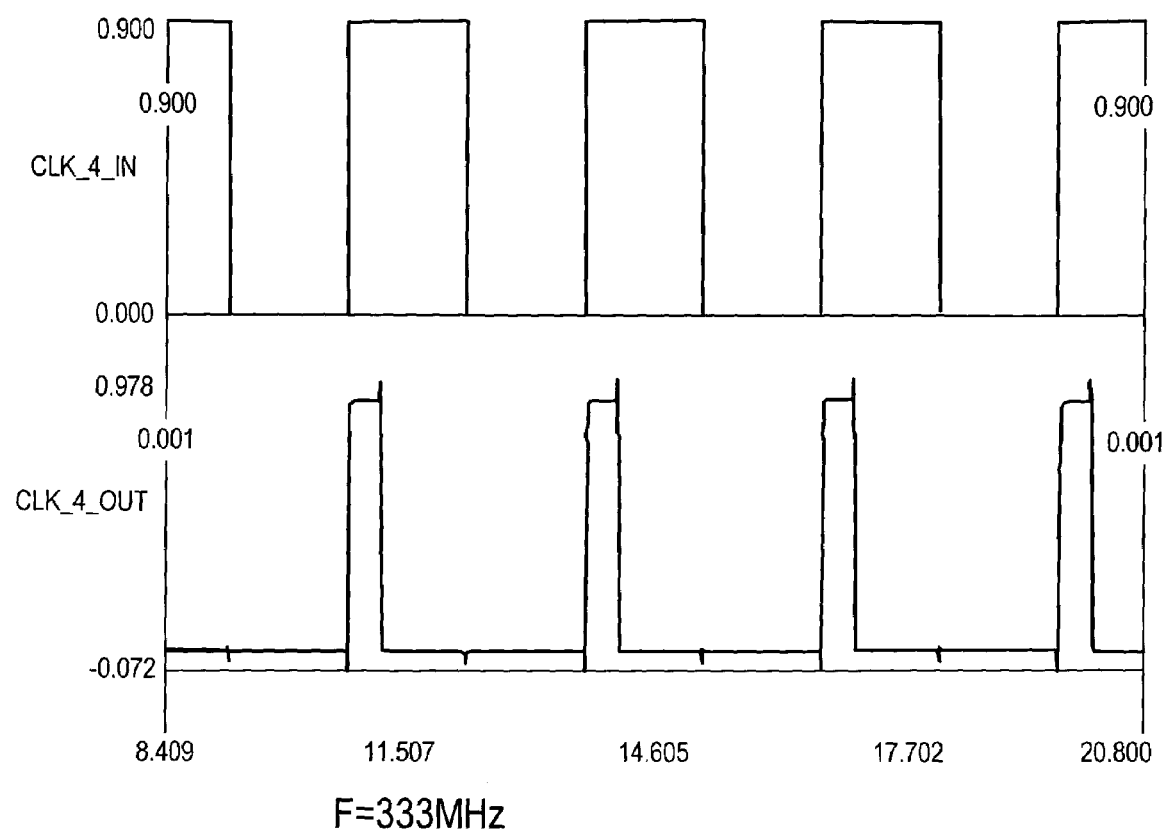
FIG. 14 illustrates a simulation result at a frequency of 333 MHz and 50% duty cycle when the maximum allowable pulse width is set to ~400 picoseconds.
Figure 15:
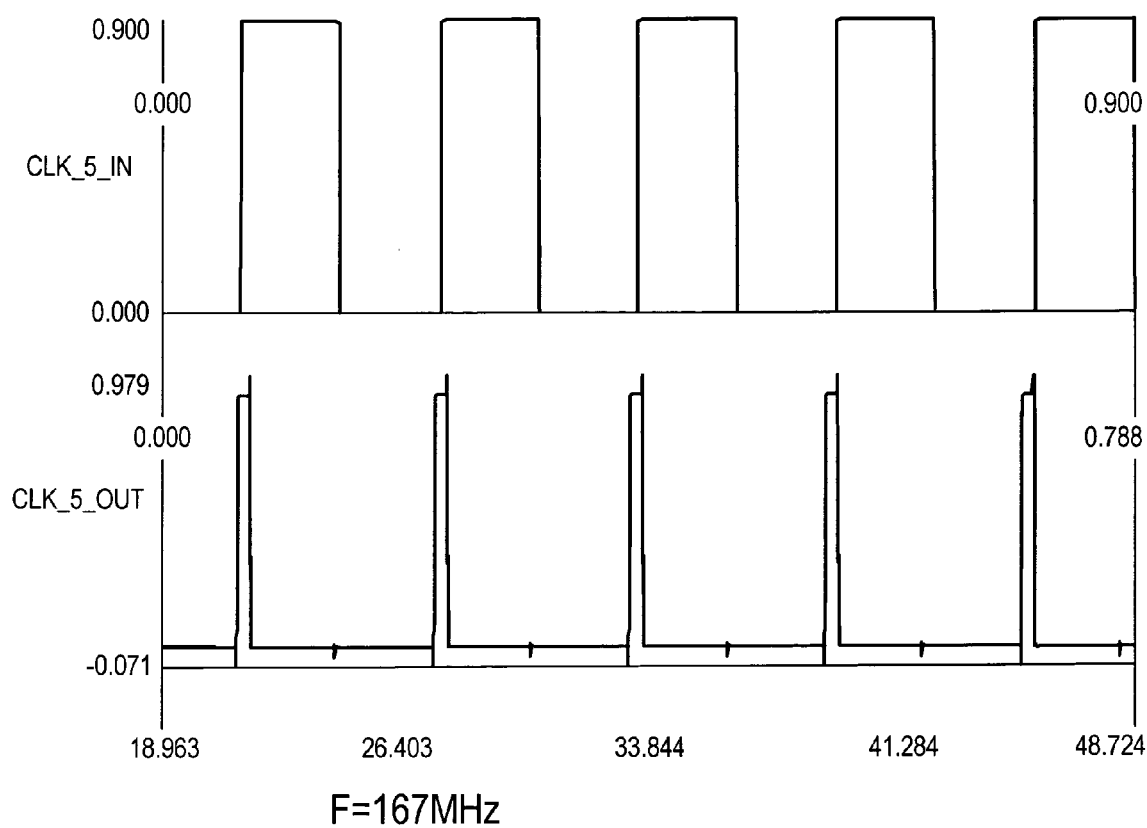
FIG. 15 illustrates a simulation result at an input frequency of 167 MHz and 50% duty cycle when the maximum allowable pulse width is set to ~400 picoseconds.

Turning now to FIGS. 10 through 15, inclusive, illustrated is a variety of spice simulation (developed in the early 70's). SPICE (Simulation Program with Integrated Circuit Emphasis, an electronic design and test simulator) results at frequencies ranging from 10 GHz to 167 MHz and 50% duty cycle when the maximum pulse width is set to ~400 picoseconds. FIG. 12 is particularly relevant to show that at the crossover frequency of F=1.25 GHz, there is no significant pulse width distortion or other glitches. Of critical importance in the performance of this circuit is its behavior at this cross over point. That is the instantaneous moment where the up time of CLK_IN is exactly equal to a maximum specified pulse width. Here, the circuit is operating at the edge of the 'pulse width limit' and 'no pulse width limit' modes. The circuit needs to behave such that crossing back and forth between these two regions does not introduce undesired spurious signals at the output.

It is understood that the present invention can take many forms and implementations. Accordingly, several variations may be made in the foregoing without departing from the spirit or the scope of the invention. The capabilities outlined herein allow for the possibility of a variety of design and programming models. This disclosure should not be read as preferring any particular design or programming model, but is instead directed to the underlying mechanisms on which these design and programming models can be built.

Having thus described the present invention by reference to certain of its salient characteristics, it is noted that the features disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description. Accordingly, it is appropriate that the appended claims be construed broadly and in a manner consistent with the scope of the invention.

The invention claimed is:

1. A pulse width limiting circuit, comprising:
a clock signal correction block configured to receive a conditioned clock signal and generate a corrected clock output signal, wherein the clock signal comprises a train of clock pulses, each of which has a rising clock edge, a falling clock edge and a variable width;
a block delay module, coupled to the clock signal correction block, configured to accept an unconditioned clock signal and introduce a specified pulse width delay to thereby generate the conditioned clock signal, wherein the block delay module comprises a plurality of delay sub-blocks of fixed delay; and
a high low clock pulse shuttle circuit, coupled to the clock signal correction block, configured to accept the conditioned clock signal, wherein the high low clock pulse shuttle comprises a first field effect transistor (FET) coupled to the correction block and a second FET coupled to a conditioned clock signal output interconnect, and wherein the high low clock pulse shuttle circuit shunts the unconditioned clock signal to the block delay module if a clock pulse width of the unconditioned clock signal is outside a pulse width limit, and wherein the unconditioned clock signal is passed as the corrected clock output signal if the clock pulse width of the unconditioned clock signal is equal to or less than the pulse width limit by bypassing the high low clock pulse shuttle circuit.

2. The system of claim 1, wherein the unconditioned clock signal is input to the source of a P-type FET in the high low clock pulse shuttle.

3. The system of claim 1, wherein the clock signal correction block further comprises a correction unit and a leak detector unit, wherein the clock signal correction block is employed to transmit the conditioned clock signal to the high low clock pulse shuttle.

4. The system of claim 2, wherein the high low clock pulse shuttle is coupled to an interconnect, wherein the interconnect is employed to convey the unconditioned clock signal.

5. The system of claim 1, further comprising a node to transmit the conditioned clock pulse between the clock signal correction block, the high low clock pulse shuttle circuit and a clock pulse inverter.

6. The system of claim 3, further comprising a leak detector calculating a voltage potential between two digital devices.

7. The system of claim 5, wherein an uncorrected clock pulse bypasses the clock signal correction block and the high low clock pulse shuttle circuit for delivery through the clock pulse inverter.

8. A method for performing a plurality of clock pulse widths limiting in clock pulses, comprising:
initiating a clock pulse as a result of a clock cycle;
forwarding the clock pulse through a clock shuttle node;
injecting the clock pulse through a block delay module in response to the clock shuttle node identifying a clock pulse width of the clock pulse as being outside a predetermined pulse width limit;
sequentially advancing a clock pulse through delay sub-blocks;
altering a clock pulse that is greater than a predetermined pulse width; and
substantially passing through the clock pulse by bypassing the clock shuttle node in response to the clock pulse width of the clock pulse being less than or equal to the predetermined pulse width limit.

9. The method of claim 8, wherein a clock pulse width is selected for correction by a specific state within a correction block.

10. The method of claim 9, wherein a clock pulse width is deselected for correction by a specific state within a correction block.

11. The method of claim 9, wherein a selected clock pulse is passed through a clock pulse correction block and checked by a leak detector.

12. The method of claim 9, wherein a deselected clock pulse is passed through a clock shuttle and output through a clock pulse inverter.

13. The method of claim 9, wherein a selected clock pulse is passed through a clock pulse correction block, checked by a leak detector, and input to a block delay module.

14. The method of claim 9, wherein the block delay module is conditioning the clock pulse using a series of delay sub-blocks.

15. The method of claim 9, wherein the delay sub-blocks are sequentially disconnecting and resetting as the clock pulse is passing.

16. The method of claim 9, wherein a completely conditioned clock pulse outputs to a conditioned clock pulse dependent device.

17. A method of providing a pulse width limiting circuit, comprising:

providing a clock signal correction block configured to receive a conditioned clock signal and generate a corrected clock output signal;

providing a block delay module, coupled to the clock signal correction block, configured to accept an unconditioned clock signal and introduce a specified pulse width delay to thereby generate the conditioned clock signal, wherein the block delay module comprises a plurality of delay sub-blocks of fixed delay, and wherein individual delay sub-blocks of the plurality of delay sub-blocks of the block delay module are disconnected and reset based on the unconditioned clock signal; and providing a high low clock pulse shuttle circuit, coupled to the clock signal correction block, configured to accept the conditioned clock signal, wherein the high low clock pulse shuttle comprises a first field effect transistor (FET) coupled to the correction block and a second FET coupled to a conditioned clock signal output interconnect, and wherein the high low clock pulse shuttle circuit shunts the unconditioned clock signal to the block delay module if a clock pulse width of the unconditioned clock signal is outside a pulse width limit, and wherein the unconditioned clock signal is passed as the corrected clock output signal if the clock pulse width of the unconditioned clock signal is equal to or less than the pulse width limit by bypassing the high low clock pulse shuttle circuit.

18. A pulse width limiting circuit, comprising:

a correction block circuit;

a block delay module coupled to the correction block circuit; and a high low clock pulse shuttle circuit, coupled to the correction block, wherein the block delay module comprises a plurality of delay sub-blocks, and wherein:

individual delay sub-blocks are disconnected and reset based on an input clock, a clock pulse is sequentially advanced through the plurality of delay sub-blocks such that the clock pulse is altered by the delay sub-blocks if the clock pulse has a pulse width greater than a predetermined pulse width, and the clock pulse is substantially passed through the pulse width limiting circuit if the pulse width of the clock pulse is less than or equal to the predetermined pulse width, and wherein the high low clock pulse shuttle circuit shunts the clock pulse to the block delay module if a clock pulse width of the clock pulse is outside a pulse width limit and wherein the high low clock pulse shuttle circuit is bypassed if the clock pulse width of the clock pulse is equal to or less than the pulse width limit.

19. The pulse width limiting circuit of claim 1, wherein when the unconditioned clock signal has a high state, the high low clock pulse shuttle circuit is bypassed, an input to the delay sub-blocks of the block delay module has a low state and the delay sub-blocks are in a reset mode of operation with their outputs being in a low state, and wherein the conditioned clock signal input to the clock signal correction block has a high state.

20. The pulse width limiting circuit of claim 1, wherein when the unconditioned clock signal has a low state, the high low clock pulse shuttle circuit outputs an input signal to the delay sub-blocks of the block delay module having a high state such that the delay sub-blocks are in a pulse width limit mode of operation, and wherein after a delay period introduced by the delay sub-blocks, an input to the clock signal correction block and an associated leak detector is placed in a low state causing the leak detector to connect the clock signal correction block to a voltage source and pull the clock output low.

21. The pulse width limiting circuit of claim 1, further comprising a node coupled to the clock signal correction block, a leak detector, and the high low clock pulse shuttle circuit, wherein the node is connected to ground when the unconditioned clock signal is low such that the node is in a floating state in which it retains its last value assuming no voltage leakage, and wherein when the unconditioned clock signal is high, any connection between the node and a voltage source is disconnected and thus, the node is pulled low.

\* \* \* \* \*